United States Patent
Stoev et al.

(10) Patent No.: US 9,668,337 B2
(45) Date of Patent: May 30, 2017

(54) TEMPERATURE MANAGEMENT IN DATA STORAGE DEVICES

(71) Applicant: Western Digital Technologies, Inc., Irvine, CA (US)

(72) Inventors: Kroum S. Stoev, Pleasanton, CA (US); Dean Mitcham Jenkins, La Canada-Flintridge, CA (US); Dale Charles Main, La Canada-Flintridge, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 14/848,158

(22) Filed: Sep. 8, 2015

(65) Prior Publication Data

US 2017/0071056 A1    Mar. 9, 2017

(51) Int. Cl.
| | | |
|---|---|---|
| *G06F 1/28* | (2006.01) | |
| *G11B 33/08* | (2006.01) | |
| *H05K 1/02* | (2006.01) | |
| *G11C 16/10* | (2006.01) | |
| *G11B 5/09* | (2006.01) | |

(52) U.S. Cl.
CPC ............ *H05K 1/0212* (2013.01); *G11B 5/09* (2013.01); *G11C 16/10* (2013.01); *H05K 2201/10159* (2013.01)

(58) Field of Classification Search
None
See application file for complete search history.

(56) References Cited

U.S. PATENT DOCUMENTS

| | | | |
|---|---|---|---|
| 6,405,277 B1 | 6/2002 | Jen | |
| 6,735,035 B1 | 5/2004 | Smith et al. | |
| 6,856,556 B1 | 2/2005 | Hajeck | |
| 6,865,506 B1 | 3/2005 | Escobar et al. | |
| 6,934,107 B2 | 8/2005 | Escobar et al. | |
| 7,126,857 B2 | 10/2006 | Hajeck | |
| 7,136,247 B2* | 11/2006 | Escobar | G11B 5/012 360/69 |
| 7,203,021 B1* | 4/2007 | Ryan | G11B 19/20 360/71 |

(Continued)

FOREIGN PATENT DOCUMENTS

| | | |
|---|---|---|
| KP | 20070096122 | 10/2007 |
| KR | 10-0604932 B1 | 7/2006 |

OTHER PUBLICATIONS

US 7,391,228, 06/2008, Greenberg et al. (withdrawn)

(Continued)

*Primary Examiner* — K. Wong
(74) *Attorney, Agent, or Firm* — Chang & Hale LLP

(57) ABSTRACT

Systems and methods are disclosed for managing temperature in a data storage device. A data storage device includes non-volatile solid-state memory, a temperature sensor, a heating device, and a controller. The controller is configured to receive a temperature signal from the temperature sensor indicating a temperature of at least a portion of the data storage device, determine that the temperature is below a first predetermined threshold, activate the heating device to increase the temperature of the at least a portion of the data storage device, and write data associated with a write command to the non-volatile solid-state memory.

19 Claims, 5 Drawing Sheets

(56) References Cited

U.S. PATENT DOCUMENTS

| | | | |
|---|---|---|---|
| 7,430,136 B2 | 9/2008 | Merry, Jr. et al. | |
| 7,447,807 B1 | 11/2008 | Merry et al. | |
| 7,502,256 B2 | 3/2009 | Merry, Jr. et al. | |
| 7,509,441 B1 | 3/2009 | Merry et al. | |
| 7,596,643 B2 | 9/2009 | Merry, Jr. et al. | |
| 7,653,778 B2 | 1/2010 | Merry, Jr. et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1* | 6/2010 | Walston | G11C 5/005 365/189.09 |
| 7,765,373 B1 | 7/2010 | Merry et al. | |
| 7,898,855 B2 | 3/2011 | Merry, Jr. et al. | |
| 7,904,211 B2* | 3/2011 | Merrow | G05D 23/1934 324/750.06 |
| 7,912,991 B1 | 3/2011 | Merry et al. | |
| 7,936,603 B2 | 5/2011 | Merry, Jr. et al. | |
| 7,962,792 B2 | 6/2011 | Diggs et al. | |
| 8,078,918 B2 | 12/2011 | Diggs et al. | |
| 8,090,899 B1 | 1/2012 | Syu | |
| 8,095,851 B2* | 1/2012 | Diggs | G06F 11/1068 714/723 |
| 8,108,692 B1 | 1/2012 | Merry et al. | |
| 8,122,185 B2 | 2/2012 | Merry, Jr. et al. | |
| 8,127,048 B1 | 2/2012 | Merry et al. | |
| 8,135,903 B1 | 3/2012 | Kan | |
| 8,151,020 B2 | 4/2012 | Merry, Jr. et al. | |
| 8,161,227 B1 | 4/2012 | Diggs et al. | |
| 8,166,245 B2 | 4/2012 | Diggs et al. | |
| 8,243,525 B1 | 8/2012 | Kan | |
| 8,254,172 B1 | 8/2012 | Kan | |
| 8,261,012 B2 | 9/2012 | Kan | |
| 8,296,625 B2 | 10/2012 | Diggs et al. | |
| 8,312,207 B2 | 11/2012 | Merry, Jr. et al. | |
| 8,316,176 B1 | 11/2012 | Phan et al. | |
| 8,341,339 B1 | 12/2012 | Boyle et al. | |
| 8,358,145 B1* | 1/2013 | Ferris | G11B 19/048 324/750.03 |
| 8,375,151 B1 | 2/2013 | Kan | |
| 8,392,635 B2 | 3/2013 | Booth et al. | |
| 8,397,107 B1 | 3/2013 | Syu et al. | |
| 8,407,449 B1 | 3/2013 | Colon et al. | |
| 8,423,722 B1 | 4/2013 | Deforest et al. | |
| 8,433,858 B1 | 4/2013 | Diggs et al. | |
| 8,443,167 B1 | 5/2013 | Fallone et al. | |
| 8,447,920 B1 | 5/2013 | Syu | |
| 8,458,435 B1 | 6/2013 | Rainey, III et al. | |
| 8,478,930 B1 | 7/2013 | Syu | |
| 8,489,854 B1 | 7/2013 | Colon et al. | |
| 8,503,237 B1 | 8/2013 | Horn | |
| 8,521,972 B1 | 8/2013 | Boyle et al. | |
| 8,542,537 B2* | 9/2013 | Parker | G11C 16/10 365/185.24 |
| 8,549,236 B2 | 10/2013 | Diggs et al. | |
| 8,583,835 B1 | 11/2013 | Kan | |
| 8,601,311 B2 | 12/2013 | Horn | |
| 8,601,313 B1 | 12/2013 | Horn | |
| 8,612,669 B1 | 12/2013 | Syu et al. | |
| 8,612,804 B1 | 12/2013 | Kang et al. | |
| 8,615,681 B2 | 12/2013 | Horn | |
| 8,638,602 B1 | 1/2014 | Horn | |
| 8,639,872 B1 | 1/2014 | Boyle et al. | |
| 8,683,113 B2 | 3/2014 | Abasto et al. | |
| 8,700,834 B2 | 4/2014 | Horn et al. | |
| 8,700,950 B1 | 4/2014 | Syu | |
| 8,700,951 B1 | 4/2014 | Call et al. | |
| 8,706,985 B1 | 4/2014 | Boyle et al. | |
| 8,707,104 B1 | 4/2014 | Jean | |
| 8,713,066 B1 | 4/2014 | Lo et al. | |
| 8,713,357 B1 | 4/2014 | Jean et al. | |
| 8,719,531 B2* | 5/2014 | Strange | G06F 11/008 711/165 |
| 8,724,422 B1 | 5/2014 | Agness et al. | |
| 8,725,931 B1 | 5/2014 | Kang | |
| 8,745,277 B2 | 6/2014 | Kan | |
| 8,751,728 B1 | 6/2014 | Syu et al. | |
| 8,769,190 B1 | 7/2014 | Syu et al. | |
| 8,769,232 B2 | 7/2014 | Suryabudi et al. | |
| 8,775,720 B1 | 7/2014 | Meyer et al. | |
| 8,782,327 B1 | 7/2014 | Kang et al. | |
| 8,788,778 B1 | 7/2014 | Boyle | |
| 8,788,779 B1 | 7/2014 | Horn | |
| 8,788,880 B1 | 7/2014 | Gosla et al. | |
| 8,793,429 B1 | 7/2014 | Call et al. | |
| 2008/0130166 A1 | 6/2008 | Auerbach | |
| 2010/0174849 A1 | 7/2010 | Walston et al. | |
| 2010/0250793 A1 | 9/2010 | Syu | |
| 2011/0099323 A1 | 4/2011 | Syu | |
| 2011/0283049 A1 | 11/2011 | Kang et al. | |
| 2012/0159200 A1 | 6/2012 | Ardron | |
| 2012/0216026 A1 | 8/2012 | Chiu | |
| 2012/0260020 A1 | 10/2012 | Suryabudi et al. | |
| 2012/0278531 A1 | 11/2012 | Horn | |
| 2012/0284460 A1 | 11/2012 | Guda | |
| 2012/0324191 A1 | 12/2012 | Strange et al. | |
| 2013/0132638 A1 | 5/2013 | Horn et al. | |
| 2013/0145106 A1 | 6/2013 | Kan | |
| 2013/0290793 A1 | 10/2013 | Booth et al. | |
| 2014/0059405 A1 | 2/2014 | Syu et al. | |
| 2014/0082255 A1 | 3/2014 | Powell | |
| 2014/0101369 A1 | 4/2014 | Tomlin et al. | |
| 2014/0115427 A1 | 4/2014 | Lu | |
| 2014/0133220 A1 | 5/2014 | Danilak et al. | |
| 2014/0136753 A1 | 5/2014 | Tomlin et al. | |
| 2014/0149826 A1 | 5/2014 | Lu et al. | |
| 2014/0157078 A1 | 6/2014 | Danilak et al. | |
| 2014/0181432 A1 | 6/2014 | Horn | |
| 2014/0223255 A1 | 8/2014 | Lu et al. | |

OTHER PUBLICATIONS

Guirong Liang, et al., U.S. Appl. No. 14/482,852, filed Sep. 10, 2014, 32 pages.
Chahwan, Temperature Mitigation for Data Storage Device, U.S. Appl. No. 14/670,361, filed Mar. 26, 2015.
International Search Report dated Dec. 6, 2016 for PCT/US2016/049297.
Written Opinion dated Dec. 6, 2016 for PCT/US2016/049297.

* cited by examiner

TEMPERATURE MANAGEMENT IN DATA STORAGE DEVICES

BACKGROUND

Field

This disclosure relates to data storage systems. More particularly, the disclosure relates to systems and methods for managing temperature in data storage devices.

Description of Related Art

Certain data storage devices can be adversely affected by high device temperatures during data programming. Low temperature in a data storage device may result in damage to physical device hardware and/or data retention/corruption issues.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1:
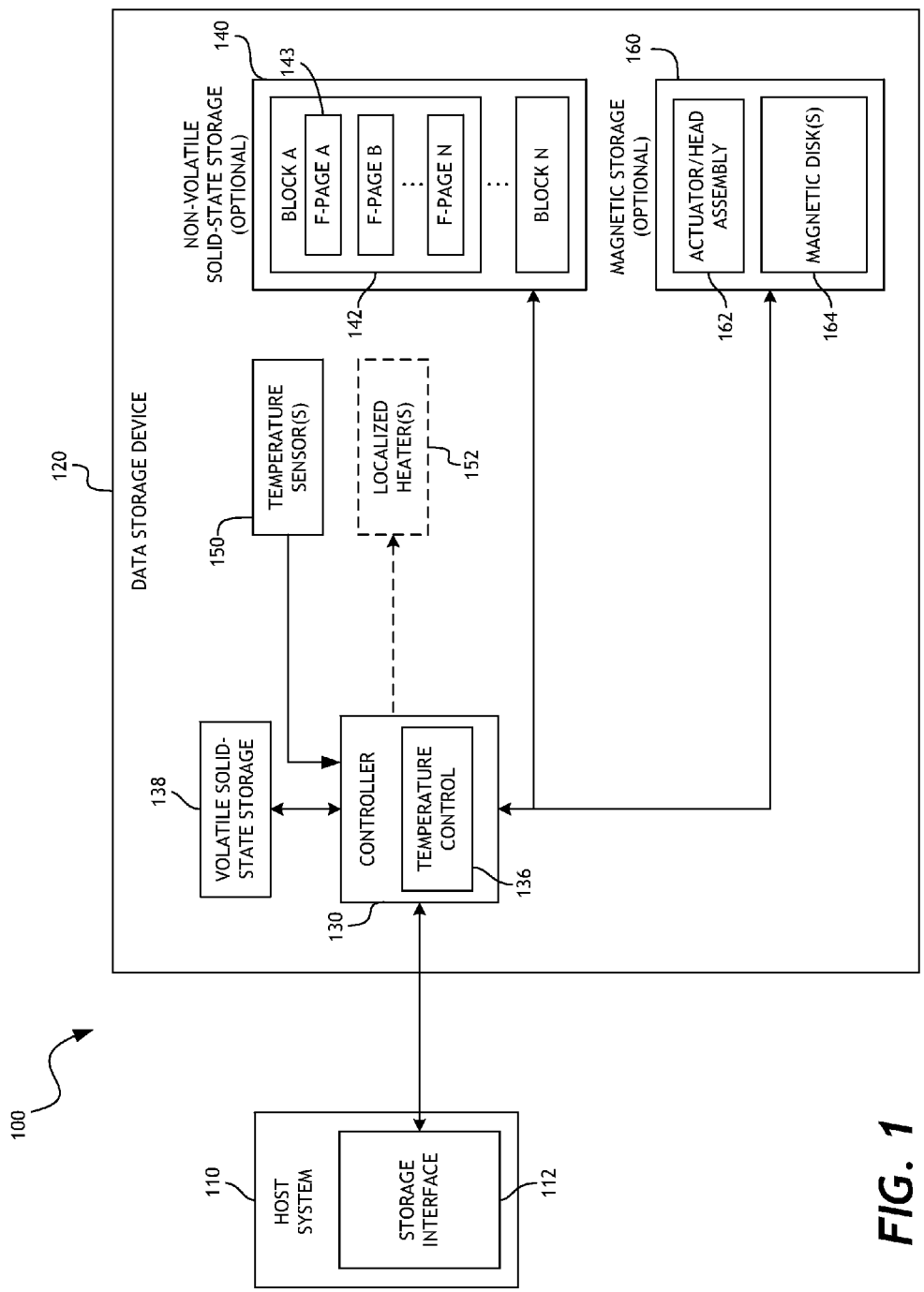
FIG. 1 is block diagram representing a data storage system according to one or more embodiments.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

The headings provided herein are for convenience only and do not necessarily affect the scope or meaning of the claims. Disclosed herein are example configurations and embodiments relating to temperature management in data storage devices.

Overview

Data storage devices can suffer from various temperature-related limitations. For example, with respect to solid-state memory, such as NAND flash, the data retention capability of memory written at relatively low temperatures may be inherently lower than that of similar memory written at relatively-higher temperatures, or within an optimal temperature range, which may be in accordance with device specifications. In order to improve the data retention capability of solid-state memory used in a storage system, it may therefore be desirable to write to the memory only when the memory is not undesirably cold. Furthermore, with respect to hard disk storage devices and/or hybrid storage devices comprising both hard disk components and solid-state storage components, temperatures lower than the relevant thermal specification ranges can cause the storage device to malfunction in some manner and/or incur premature wear. For the sake of simplicity, the rotating magnetic components commonly found in hard disk storage devices will be referred to as hard disk components, memory/media components, and/or devices. Therefore, thermal stabilization can be a concern in certain data storage environments.

As an example environment in which temperature issues may be a concern, data storage devices disposed in certain ambient-cooled data centers can experience temperatures that can be relatively low, which may in turn cause reduced data retention capability and/or other issues. For example, certain data centers may implement various measures to conserve power, such as by using ambient or outside air to cool the data center; when these data centers are located in very cool climates, the ambient temperature can be relatively cold; data storage devices may be located in "cold storage" or powered-off regions within a data center. Certain other applications may exist where data storage devices might be powered up in environments colder than the low end of their thermal specification. Thermal specifications for data storage device may specify operational temperatures between, for example, 25-85° C. When data storage devices are powered on while they are operating outside of their thermal specification, damage to the storage device and/or premature wear of certain memory components thereof, such as installed NAND devices, may result.

With respect to solid-state data storage, in order to allow a solid-state storage device, or solid-state memory component of a hybrid data storage device, to benefit from improved data retention capability in potentially cold environments, increasing the temperature in such devices prior to allowing writes to memory (e.g., NAND) can be beneficial and possibly improve performance under certain conditions. Furthermore, certain embodiments of data storage devices disclosed herein are configured to sense device temperature and at least partially restrict memory write access (e.g., NAND access) until the proper memory temperature is reached. Certain embodiments provide for the increasing of device and/or memory temperature through various means or mechanisms. Device preheating may be implemented by executing certain functions of device hardware and/or firmware in order to achieve a proper temperature range for programming, for example. In certain embodiments, activation of one or more communication interfaces, such as ONFI/TOGGLE interface(s) to the target memory (e.g., solid-state, such as NAND) may be performed in such a way as to produce thermal increase. For example, one or more blocks or other memory segments may be reserved to be erased, programmed and/or read as a mechanism for exciting the memory electronics, thereby consuming additional power and producing additional thermal energy within the device.

With respect to hard disk data storage, in order to allow a hard disk storage device, or hard disk memory component of a hybrid data storage device, to function properly, it may be desirable to raise device temperature to optimal operating temperature (e.g., within thermal specification) prior to full data/system interaction. Certain embodiments disclosed herein provide for temperature monitoring and/or restriction of host access until the proper device temperature is reached. To increase the hard disk storage device temperature, a preheating or thermal generation mode may be executed via firmware and/or specialized hardware to promote more rapidly reaching the operating temperature range. In certain embodiments, providing one or more "dirty" tracks (tracks with many specially introduced data errors) that may cause multiple read channel iterations to increase thermal energy may be utilized among other mechanisms and/or methods for exciting the electronics, thereby potentially providing increased power consumption and/or thermal energy within the storage device.

Certain embodiments disclosed herein provide a process for managing temperature in a data storage device. The process may involve receiving a temperature signal from a temperature sensor associated with a data storage device, the temperature signal indicating a temperature of at least a portion of the data storage device. The process may further involve determining that the temperature is below a first predetermined threshold, activating a heating device of the data storage device to increase the temperature of the at least a portion of the data storage device, and writing data associated with a write command to the non-volatile solid-state memory.

In certain embodiments, increasing the temperature of the at least a portion of the data storage device above the first predetermined threshold is achieved at least in part by said activating the heating device. The process may further involve determining that the temperature of the at least a portion of the data storage device has risen above a second predetermined threshold before writing the data to the non-volatile solid-state memory. The first predetermined threshold and the second predetermined threshold may be the same.

The heating device may include a resistive heating device. The data storage device may include a printed circuit board (PCB), wherein the non-volatile solid-state memory is mounted to a first side of the PCB. In certain embodiments, the heating device is mounted to a second side of the PCB opposite the first side. Alternatively, the heating device may be mounted to the first side of the PCB proximal to the non-volatile solid-state memory. In certain embodiments, the first predetermined threshold is approximately 25° C.

Certain embodiments disclosed herein provide a process of managing temperature in a data storage device including a non-volatile media. The process may involve receiving a temperature signal from a temperature sensor of a data storage device, the temperature signal indicating a temperature of at least a portion of the data storage device. The process may further involve determining that the temperature is below a threshold, initiating activity in one or more components of the data storage device to increase the temperature of the at least a portion of the data storage device, and processing a write command to write data associated with the write command to the non-volatile media.

In certain embodiments, initiating activity in the one or more components includes reading data stored in the non-volatile media. Additionally or alternatively, initiating activity in the one or more components may include introducing errors into the data read from the non-volatile media to increase error correction activity in the data storage device.

The non-volatile media may include a head and a rotating magnetic disk, wherein initiating activity in the one or more components involves spinning the rotating magnetic disk. The non-volatile media may include a head and a rotating magnetic disk, wherein initiating activity in the one or more components involves seeking the head. In certain embodiments, the non-volatile media includes non-volatile solid-state memory, wherein initiating activity in the one or more components includes performing one or more data operations on a reserved area of the non-volatile solid-state memory that is not used to store host data. Initiating activity in the one or more components may involve performing data management activities on the non-volatile media. After initiating activity in the one or more components, the process may further involve determining whether the temperature is at or above the threshold, and if so, notifying a host device that it is ready to receive write commands.

Certain embodiments disclosed herein provide a process of managing temperature in a data storage device, the process involving writing data associated with a write command to a non-volatile solid-state memory of a data storage device, storing write temperature data indicated by a temperature sensor of the data storage device, determining that a temperature of at least a portion of the data storage device has risen above a predetermined threshold, and re-writing the data to the non-volatile solid-state memory based at least in part on the write temperature data.

In certain embodiments, re-writing the data based at least in part on the write temperature data may involve prioritizing garbage collection operations of the data storage device based on the write temperature data. Re-writing the data may be performed in response to determining that the temperature of at least a portion of the data storage device has risen above the predetermined threshold. The write temperature data may indicate whether the data associated with the write command was written when the at least a portion of the data storage device was below the predetermined threshold.

System Overview

Certain embodiments disclosed herein provide novel methods and systems for at least partially extending the life of data storage (e.g., solid-state NAND memory) at low temperatures as well as the raw BER (e.g., more than 0.5). For example, systems and methods provided herein may enable data storage devices to heat up solid-state and/or hard disk memory components at low temperatures and/or to protect the data recorded at low temperatures, thereby improving reliability and/or extending the useful life of the memory. Therefore, certain embodiments may at least partially solve issues associated with the vulnerability of certain memory components/devices at relatively low temperatures to program/erase cycles or other interaction, as well as data retention issues. For example, where data is recorded at low temperature and subsequently retained at high temperature, data retention can be a concern in certain embodiments.

In solid-state devices, various mechanisms may be implemented to increase device activity for the purpose of increasing temperature within at least a portion of the device. For example, embodiments disclosed herein provide for device heating through increased device activity through one or more of the following mechanisms or processes: powering-up the device controller with high-data rate random activity; reading pages at random; additional low-density parity-check (LDPC) channel iterations; and performing additional processor computations in addition to the current duty cycle. Such activity may raise device temperature in at least a portion of the device by up to 5-15° C. With respect to magnetic/hard disk media, temperature increases may be achieved through one or more of the following mechanisms: operation of the head gimbal assembly; activating the spindle motor and/or actuator motor, or other activity. Various other mechanisms may be implemented to raise temperature in hard disk devices, or hybrid data storage devices including hard disk memory.

Hybrid data storage systems are data storage systems that may comprise one or more data storage sub-systems, namely one or more hard disk drives (HDD) comprising magnetic storage media, as well as one or more solid-state storage drives (SSDs) comprising non-volatile solid-state media such as NAND flash, for example. In the context of a singular device, a hybrid data storage device may include rotating magnetic storage and solid-state storage. The various embodiments disclosed herein may be applied to hard disk storage devices/systems, solid-state storage devices/system, and/or hybrid storage devices/systems. For the sake of simplicity of description, a generic singular hybrid data storage device may be described herein as an example to refer to any of the aforementioned variations of data storage devices/systems.

FIG. 1 is a block diagram illustrating an embodiment of a combination of a host system 110 with a data storage device 120 incorporating temperature management functionality in accordance with one or more embodiments disclosed herein. As shown, the data storage device 120 includes a controller 130 configured to receive data commands and execute such commands in a non-volatile solid-state memory 140, which may include non-volatile solid-state memory cells, and/or in a magnetic storage device 160, which may include magnetic media 164, such as one or more magnetic disks. The magnetic storage 160 may include an actuator/head assembly 162 for executing reads/writes in the media 160. The non-volatile solid-state storage 140 and/or magnetic storage 160 may further include cache memory (not shown).

The host commands received by the controller 130 from the host system 110 may include data read/write commands, and the like. The controller 130 may be configured to receive data commands from a storage interface (e.g., a device driver) 112 residing on a host system 110. Data may be accessed/transferred based on such commands. The host's storage interface 112 can communicate with the data storage device 120 using any known communication protocol, such as SATA, SCSI, SAS, USB, Fibre Channel, PCIe, eMMC, or the like.

As used in this application, "non-volatile solid-state memory," "NVSM," "non-volatile memory," "NVM," or variations thereof may refer to solid-state memory such as NAND flash. However, the systems and methods of this disclosure may also be useful in more conventional hard drives and hybrid drives including both solid-state and hard drive components. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips. The non-volatile solid-state memory arrays or storage devices may be physically divided into planes, blocks, pages, and/or sectors, as is known in the art. Other forms of storage (e.g., battery backed-up volatile DRAM or SRAM devices, magnetic disk drives, etc.) may additionally or alternatively be used.

The data storage device 120 can store data received from the host system 110 such that the data storage device 120 acts as data storage for the host system 110. To facilitate this function, the controller 130 may implement a logical interface. The logical interface can present to the host system memory as a set of logical addresses (e.g., sequential/contiguous addresses) where data can be stored. Internally, the controller 130 can map logical addresses to various physical memory addresses in the non-volatile solid-state storage 140 and/or magnetic storage module 160.

Mapping data indicating the mapping of logical addresses to physical memory addresses may be maintained in the data storage device 120. For example, mapping table data may be stored in non-volatile solid-state storage 140 and/or magnetic storage module 160 in order to allow for recreation of mapping tables following a power cycle. In certain embodiments, the controller 130 may maintain a mapping table to address the solid-state storage mapping, whereas the magnetic storage 160 portion of the storage device 120 may be addressed directly. Furthermore, the controller 130 may maintain a special mapping table to determine whether data is stored in the solid-state storage 140 or the magnetic storage 160.

The controller 130 may include one or more memory modules, such as non-volatile memory (e.g., ROM) and/or volatile solid-state storage 138 (e.g., RAM, such as DRAM). In certain embodiments, the controller 130 may be configured to store information, including, for example, operating system(s) code, application code, system tables and/or other data in such memory module(s). On power-up, the controller 130 may be configured to load the data for use in operation of the data storage device 120. In one embodiment, the controller 130 is implemented on a SoC (system on a chip), though those skilled in the art will recognize that other hardware/firmware implementations are possible.

As discussed above, low temperatures in the data storage device 120 can lead to increased error rate and/or premature ware when data is written to the solid-state storage 140 and/or magnetic storage 160 under such conditions. Generally, for solid-state memory, the amount of increase in error rate may be proportional to the degree to which the temperature associated with the memory drops below a threshold value, such as 25° C. In order to prevent or reduce the effects of low temperatures in the storage device 120, or portion thereof, the hybrid data storage device 120 may include one or more temperature sensors 150, which may be disposed within a housing of the storage device. For example, one or more temperature sensors may be disposed in physical proximity to either or both of the magnetic storage 160, such as in, or associated with, a disk head and/or suspension structure of the magnetic storage, and the solid-state storage 140. The temperature sensor(s) 150 may be configured to detect temperature levels associated with at least a portion of the hybrid data storage device 120.

In certain embodiments, the controller 130 is configured to maintain historical data indicating write times (e.g., timestamp data) and/or temperatures associated with data written to one or both of the non-volatile solid-state storage 140 and magnetic storage 160. Such data may be used in determining when and/or how to execute various drive maintenance operations, such as wear leveling, garbage collection, or the like. In certain embodiments, historical write time and/or temperature data may be relied upon in setting read threshold levels for solid-state memory reads. In certain embodiments, data written at lower temperatures may be associated with relatively stronger error rates, wherein the data is recorded with an increased amount of error correction codes/data. Such tracking and utilization of write time and/or temperature data may improve the ruggedness of the data storage device 120 with respect to at least one component or module of the device 120. For example, through the keeping of such historical data, data written as low temperature may be identified and prioritized for garbage collection when the data storage device experiences a higher temperature at a later time. In one embodiment, the lower the temperature of the write, the higher priority the garbage collection for the written data will be.

The controller 130 may include one or more heater devices 152 disposed locally within, or adjacent to, the storage device 120. The heater(s) 152 may be implemented to bring one or more portions or components of the storage device 120 to an acceptable temperature for writing data to either or both of the solid-state storage 140 and magnetic storage 160.

Figure 2:
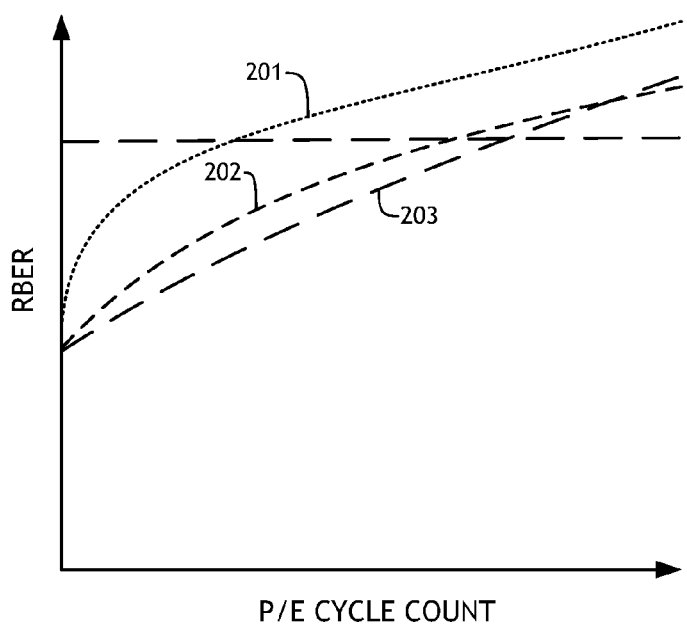
FIG. 2 is a graph showing performance in a data storage device relative to program/erase cycle count according to one or more embodiments.

FIG. 2 is a graph showing performance in a data storage device relative to program/erase cycle count according to one or more embodiments. The graph of FIG. 2 may correspond to data retention characteristics associated with data written to solid-state memory (e.g., NAND) at about 0° C., which is considered to be a low temperature. The subject memory reflected in the graph may be, for example, 20 nm cMLC. The short-dashed line curve 201 may represent the bit error rate of the memory detected at approximately 1-week data retention, whereas the medium-dashed line 202 and long-dashed line 203 curves may represent the like data at approximately 1-day data retention and substantially no data retention, respectively. As demonstrated in the graph, during program/erase (P/E) cycling, solid-state memory can have a lower data retention ability at low temperature, and such lower ability is further worsened when the memory is worn, as indicated by the worsening of bit error rate (RBER) with increased P/E cycles. Furthermore, it may be especially difficult for the memory to retain data programmed at low temperature. The straight horizontal line in the graph may represent the error correction capability of the channel, which indicates the threshold number of bit errors above which would cause uncorrectable and/or unrecoverable errors.

Figure 3:
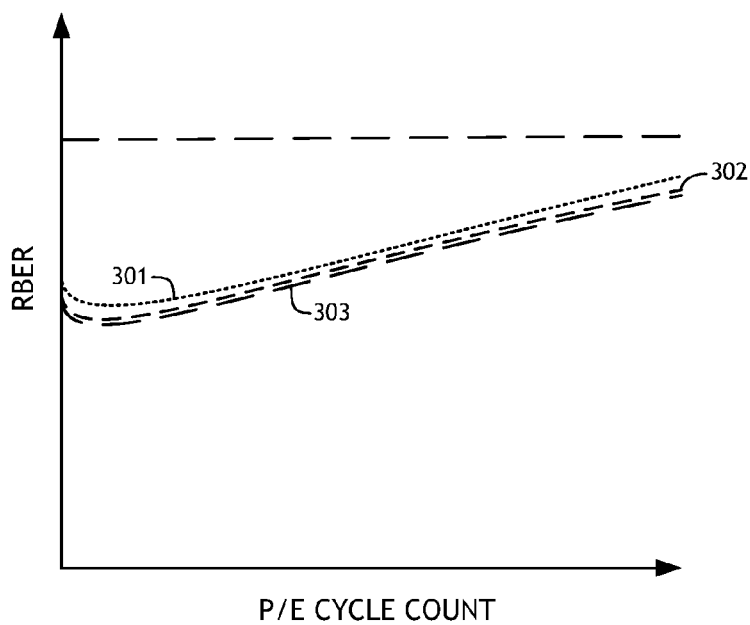
FIG. 3 is a graph showing performance in a data storage device relative to program/erase cycle count according to one or more embodiments.

FIG. 3 is a graph that is similar to FIG. 2, showing instead performance in a data storage device relative to program/erase cycle count according to one or more embodiments. The graph of FIG. 3 may correspond to data written at a higher temperature (e.g., at a temperature of approximately 85° C.) than that represented in FIG. 2. As shown, data written at temperatures within an optimal range may exhibit substantially less sensitivity to data retention issues, even if the memory has experienced a substantial amount of wear. All three curves (1-week lapse 301, 1-day lapse 302, or no time lapse 303) show an amount of errors within the channel's error correction capability.

Localized Heater

Figure 4:
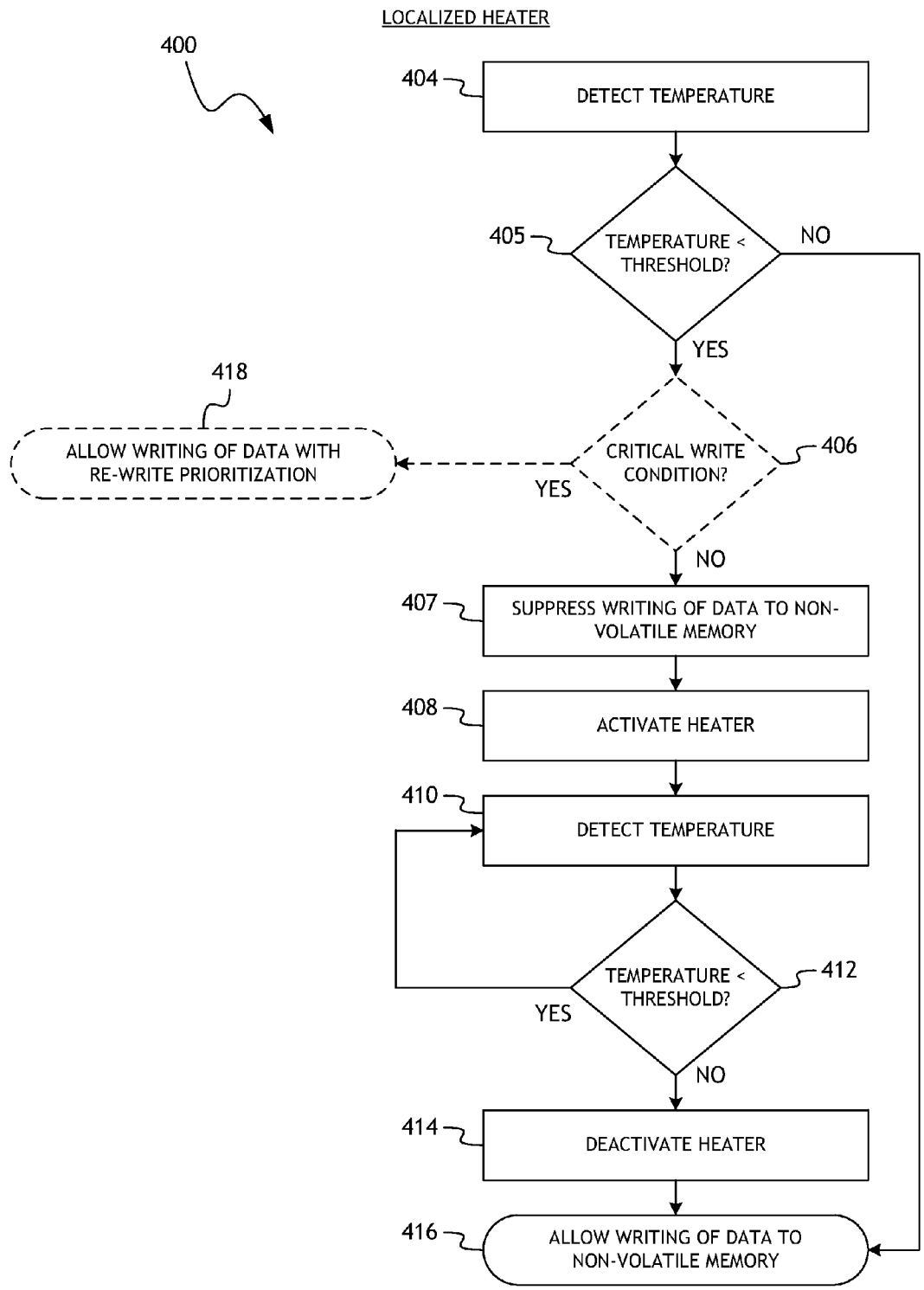
FIG. 4 is a flow diagram illustrating a process for managing temperature in a data storage system according to one or more embodiments.

FIG. 4 is a flow diagram illustrating a process 400 for managing temperature in a data storage system according to one or more embodiments. The process 400 may be implemented to effectively maintain a device temperature in at least a portion of the device (e.g., a temperature associated with a non-volatile memory to which host data is written) at or around a target temperature, such as 25° C., or above.

At block 404, the process 400 involves detecting a temperature of at least a portion of a data storage device. For example, one or more temperature sensors may be utilized to determine the temperature in at least a region of the storage device proximal to a memory module to which data associated with the write command may be written. As described above, low temperature can adversely affect data retention in solid-state memory devices, and can result in certain device malfunctioning and/or premature ware in hard disk memory devices. Detecting temperature may be triggered in connection with a system power-up and/or may be performed periodically or sporadically. In certain embodiments, temperature detection may be triggered by the receipt of a write command or other host command.

With regard to solid-state memory, error rates at various data retention intervals may be relatively worse when data is written at low temperature (e.g., 0° C.), as compared to high temperature (e.g., 85° C.). Even after a short duration post-write, coldly written data may have error rates above of the horizontal line in FIGS. 2 and 3 showing the channel's error correction capability.

At decision block 405, the process 400 involves determining whether the detected temperature is below a certain threshold level. In certain embodiments, when device firmware detects a temperature in at least a portion of the device that is lower than a threshold level (e.g., below 25° C.), the process 400 may involve making a further determination at block 406 of whether a critical write condition exists in which it is necessary or desirable to perform data writes to a non-volatile memory in spite of a low-temperature state of the non-volatile memory. If so, the process may proceed to block 418, wherein data writes to the non-volatile memory may be allowed to proceed in accordance with a data re-write prioritization scheme. Data re-write prioritization is described below in greater detail in connection with FIG. 6. In certain embodiments, the determination at block 406 is not performed, and a positive determination at block 405 causes the process to proceed directly to block 407. At block 407, data writing to the non-volatile memory may be at least partially suppressed in view of the low detected temperature. Such suppression may substantially prevent user data from being written to the non-volatile memory under low-temperature conditions, which can result in various adverse effects, as described above.

In order to avoid data being written unnecessarily to the non-volatile memory at temperatures below the temperature threshold, certain embodiments provide for utilization of one or more localized heaters to bring the temperature associated with the non-volatile memory to a safe level prior to allowing data writes. At block 408, one or more heaters may be enabled to produce thermal energy to heat the relevant memory component(s). The amount of thermal energy produced may be proportionate to the device temperature detected. In certain embodiments, the heating mechanism may produce thermal energy output that corresponds to a substantially linear response based on detected temperature between a certain temperature range (e.g., between 25° C. and −40° C.). In some embodiments, blocks 404, 405 and 406 may be entered and executed into without necessarily being contingent upon the receipt of a write command.

If the detected temperature is not below the relevant threshold level—that is, if the temperature of the at least a portion of the device is greater than the relevant threshold and thus within satisfactory operational temperature ranges—the process 400 proceeds to block 416, where write data associated with the write command is written to non-volatile memory of the data storage device.

Certain embodiments disclosed herein provide for the use of one or more heater devices disposed in thermal proximity to one or more memory modules, such as solid-state memory module(s) (e.g., NAND). Such heater device(s) could comprise one or more resistive heater devices and/or one or more other types of heaters. If the temperature is determined at block 406 to be below the relevant threshold, the process 400 proceeds to block 408, where one or more heaters within the storage device, or associated there with, or proximal thereto, may be activated in order to heat at least a portion of the data storage device.

In certain embodiments wherein the target memory comprises solid-state memory, the solid-state memory module (e.g., NAND) may be disposed on a printed circuit board (PCB). For implementing the heating functionality as described herein, one or more resistive heaters may be printed and/or disposed on the PCB, wherein such heaters are designed to generate thermal energy from electrical current flowing therein. Certain embodiments implement one or more nickel-chrome, tungsten, and/or other type of resistors.

One or more temperature sensors may reside in the device, such as on a printed circuit board (PCB) with which the solid-state memory module is associated. When a temperature below a threshold level (e.g., 25° C.) is detected, the heater(s) may be enabled to maintain the temperature of the solid-state memory at or about the threshold temperature, or at a temperature above the threshold temperature or within a range of the threshold temperature.

The heating devices may provide localized heating for one or more memory modules and may have any desirable or suitable configuration, number and/or arrangement. In certain embodiments, one or more heaters may be disposed on an underside of the PCB substantially opposite a target memory module. In certain embodiments, one or more heaters are disposed at least partially underneath a memory module, such as a die, on the same side of the PCB as the memory module. Additionally or alternatively, one or more heaters may be disposed at least partially above or on top of a memory module. In certain embodiments, one or more heaters may be disposed on or adjacent to one or more sides of a memory module, such as between memory modules on a PCB. The configuration of heating devices may advantageously leverage existing circuitry. In certain embodiments, such as in a hybrid storage device embodiment, one or more heaters may be associated with a head assembly for reading/writing for disk media.

At block 410, the process 400 involves detecting the temperature of at least a portion of the data storage device again. At decision block 412, the process 400 involves determining whether the temperature of the data storage device subsequent to activation of the one or more heaters has risen above the threshold level. If the temperature of the data storage device, or portion thereof, remains below the relevant threshold, the process 400 proceeds back to block 410, where more time may be allowed for the activated heater(s) to increase the temperature of the device. If the temperature is determined to have risen above the threshold, the process 400 proceeds to block 414, where the one or more heaters may be deactivated. The process 400 may provide for device operation at substantially safe temperatures even when the device is subject to environmental conditions involving relatively low temperatures, such as temperatures below 0° C. In such conditions, for a hybrid storage device, use of the disk storage may be restricted, such that the solid-state memory component(s) alone are utilized for writing new data.

With the data storage device, or portion thereof, within the satisfactory operational thermal range, the process 400 involves, at block 416, allowing writing of data to the non-volatile memory of the data storage device.

Implementation of the process 400 to increase temperature relatively rapidly in, for example, a solid-state memory (e.g., NAND) based device that is below desirable operating temperature may provide improved data retention capability of the solid-state memory. The process 400 may at least partially prevent user data area(s) of the solid-state memory from being written when the device or localized memory temperature is undesirably cold, which, as described above, can significantly reduce the data retention capability of certain solid-state memories.

Heating Through Increased Activity

As described herein, it may be desirable for components of a data storage device, such as magnetic media, magnetic heads, electronics and/or solid-state memory to be within specified ranges to operate effectively and reliably. In certain environments, there is a possibility for data storage devices to be out of operating temperature range when power is first applied. During the time it takes for the data storage device, such as a disk drive, to "warm up" to the proper temperature, the possibility of damage to components (e.g., heads flying at improper heights, premature NAND wear-out) can cause adverse results. In addition to magnetic disk memory, solid-state memory (e.g., NAND) may advantageously be heated in order to avoid a significant reduction in the data retention capability of the memory; the temperature of the solid-state memory may advantageously be brought to a range with better data retention ability before data is written thereto.

Certain embodiments disclosed herein provide for hardware and/or software/firmware systems and mechanisms for relatively rapidly heating a data storage device, or portion thereof. In certain embodiments, host operation may be delayed to allow the data storage device, or portion thereof, to enter a desirable thermal operating range more quickly, thereby potentially increasing reliability. Heating mechanisms disclosed herein may involve initiating activity within the data storage device, such as by executing software/firmware routines and/or energizing specific hardware to warm at least a portion of the device. When the temperature is within a desirable operating range, the host may be permitted to accept commands.

With regard to hard disk memory devices and/or components, certain embodiments provide for the reservation/creation of one or more "dirty" tracks including intentionally-introduced errors, and reading "dirty" track(s) in order to cause multiple iterations of the read channel to correctly read data. Certain embodiments provide for increased activity through execution of read and/or write commands to memory, such as to a double data rate (DDR) memory module. Certain embodiments provide for increased device activity through additional sequential reading from the storage media. Certain embodiments provide for increased device activity through the execution of random seek operations.

With regard to solid-state memory devices and/or components, specific routines or hardware mechanism may be utilized to increase the thermal temperature of a solid-state device, while holding off host write operations. Such processes may allow the solid-state memory to enter a safe thermal operating range, thereby increasing the data retention capability of the memory. The thermal energy-generating device activity may involve any of a number of possible processes and/or mechanisms. Certain embodiments provide for the usage of specific reserved block(s) of memory (e.g., blocks of NAND memory) used exclusively or primarily for operations to pre-heat the device. Certain embodiments provide for ONFI and/or solid-state memory block activity caused by device-heating routines and/or energizing of specific hardware, which may cause the desired heating in the storage device. When the temperature reaches the desirable operating range, the device may be allowed to write to the NAND. Certain embodiments provide for device heating through reading and transferring data from the solid-state memory to the memory controller. Certain embodiments provide for device heating through the issuance of benign memory management commands to the solid-state memory.

Certain embodiments provide for reservation and/or dedication of one or more blocks of solid-state memory to be used by the preheating mechanism(s)/algorithm(s). Such block(s) may be used only for user data; damage to such block(s) due to overuse may be acceptable. For example, heating algorithms may involve erasing the reserved block(s) repeatedly, programming the reserved blocks(s) repeatedly, and/or reading the reserved block(s) repeatedly.

Although certain mechanisms are described for increasing temperature through increased activity in a data storage device, it should be understood that any combination of mechanisms disclosed herein may be implemented within the scope of the present disclosure. Furthermore, other mechanisms for increasing temperature through increased activity, such as algorithms aimed at exciting certain device electronics in order to increase thermal energy in a relatively short period of time.

Figure 5:
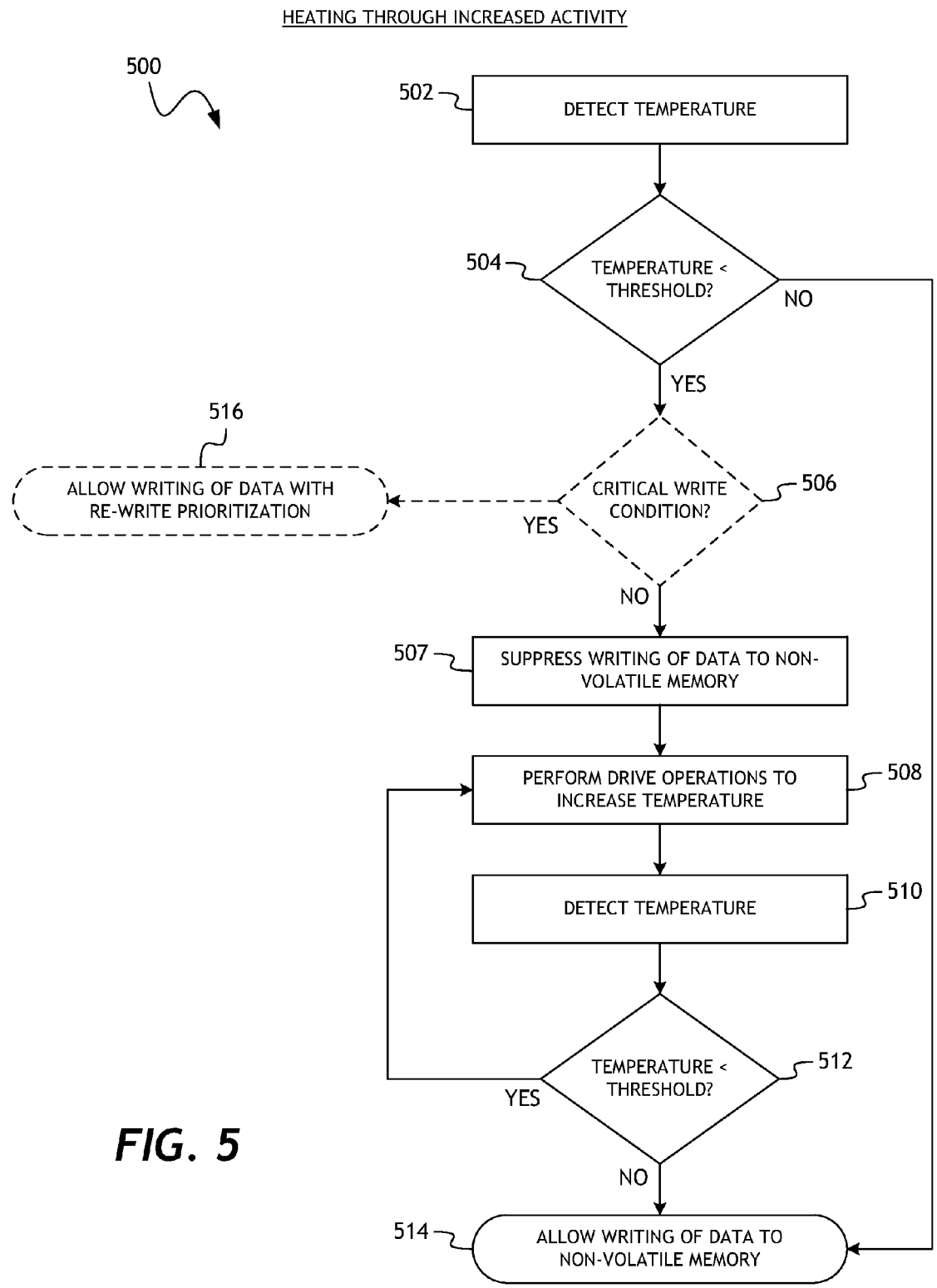
FIG. 5 is a flow diagram illustrating a process for managing temperature in a data storage system according to one or more embodiments.

FIG. 5 is a flow diagram illustrating a process 500 for managing temperature in a data storage system according to one or more embodiments. At block 502, the process 500 involves detecting a temperature associated with at least a portion of a data storage device (e.g., a temperature associated with a non-volatile memory of the data storage device to which host data is written). Detecting temperature may be triggered in connection with a system power-up and/or may be performed periodically or sporadically. In certain embodiments, temperature detection may be triggered by the receipt of a write command or other host command.

At block 506, it is determined whether the temperature of the data storage device, or portion thereof, is below a certain threshold temperature. If the temperature is not below threshold temperature, the process 500 may proceed to block 514, where write data associated with the received write command may be written to non-volatile memory of the data storage device.

If the temperature is determined to be below the relevant threshold level, the process 500 may involve making a further determination at block 506 of whether a critical write condition exists in which it is necessary or desirable to perform data writes to a non-volatile memory in spite of a low-temperature state of the non-volatile memory and/or data storage device. If so, the process 500 may proceed to block 516, wherein data writes to the non-volatile memory may be allowed to proceed in accordance with a data re-write prioritization scheme. Data re-write prioritization is described below in greater detail in connection with FIG. 6. In certain embodiments, the determination at block 506 is not performed, and a positive determination at block 504 causes the process to proceed directly to block 507. At block 507, data writing to the non-volatile memory may be at least partially suppressed in view of the low detected temperature. Such suppression may substantially prevent user data from being written to the non-volatile memory under low-temperature conditions, which can result in various adverse effects, as described above.

In order to avoid data being written unnecessarily to the non-volatile memory at temperatures below the temperature threshold, certain embodiments provide for execution of certain increased device activity to bring the temperature associated with the non-volatile memory to a safe level prior to allowing data writes. At block 508, certain drive operations may be performed as a mechanism to increase temperature in at least a portion or region of the data storage device. The process 500 may involve powering-up the device controller with relatively high data rate random activity. For example, pages may be read at random and/or errors may be introduced intentionally, such that the channel (e.g., for low-density parity-check (LDPC) embodiments) goes through additional iterations, processor computations, and the like, in addition to the current duty cycle. Intentional error introduction may be achieved by flipping bits of read data, which may lead to increased activity in the error channel. In certain embodiments, reading a reference pattern and performing an operation, such as an XOR with a random pattern, and feeding it to the channel, thereby producing increased error channel activity. In the case of a hybrid data storage device, the magnetic disk may be spun-up for the purpose of increasing device temperature, even when the data is being written only to the solid-state component(s) of the device.

Heating storage device components rapidly in a disk drive that is below operating specification can provide improved reliability as there may be a shorter time for which the mechanics operate outside of device specifications. In addition, user data may not be compromised due to host access to user data while outside of thermal specification conditions.

At block 510, the process 500 may involve detecting a temperature of at least a portion of the data storage device again in order to determine whether the temperature has risen above the threshold level. The system block 512 of the process 500 involves determining whether the temperature has risen above the threshold. If not, the process 500 may proceed back to block 508, where additional drive operations may be executed in order to continue to raise the temperature of the data storage device. If the temperature has risen above the threshold, the process 500 may proceed to block 514, where data may be allowed to be written to the non-volatile memory of the data storage device.

Data Re-Write Scheduling

For certain storage device maintenance operations, such as garbage collection, wear leveling, and the like, write temperature may be considered in determining priority/timing for execution of such operations. In certain embodiments, write temperature may be considered a primary factor for determining maintenance scheduling, among other possible factors, such as P/E cycle count, age of data, amount of invalid data, and the like.

In certain situations, recording data at low temperatures may be necessary or desirable. For example, a surveillance device in public transportation vehicle, or devices operating in high altitudes (e.g., drones), may necessarily record data in relatively cold environments (e.g., −20° C., or lower, in certain conditions). Certain embodiments disclosed herein provide for prioritized re-writing of data recorded at low temperatures when the data storage device has subsequently experienced an increase in temperature. Rewriting of data written at low temperatures may help extend the range of the device capability.

Figure 6:
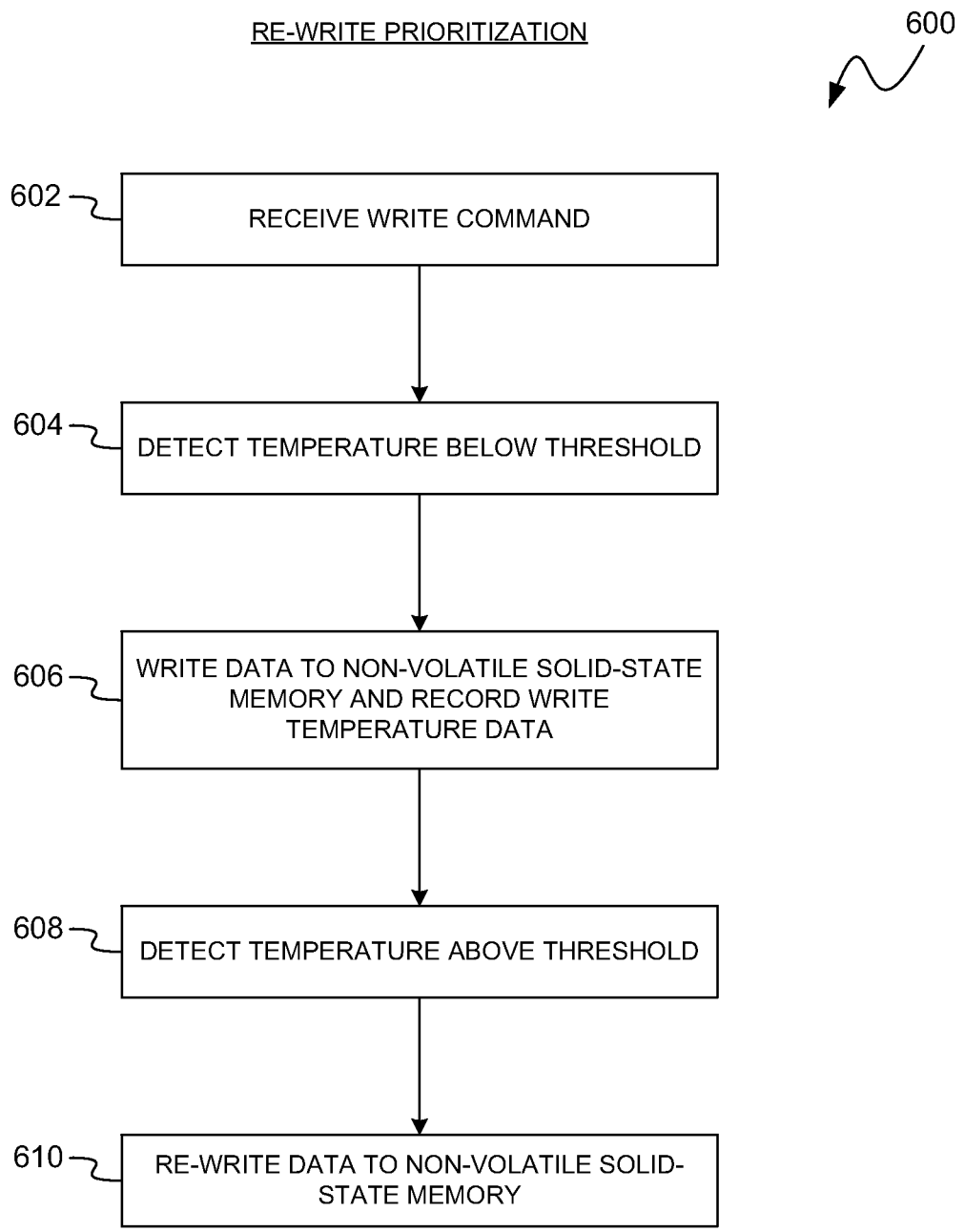
FIG. 6 is a flow diagram illustrating a process for managing temperature in a data storage system according to one or more embodiments.

FIG. 6 is a flow diagram illustrating a process for managing temperature in a data storage system according to one or more embodiments. While certain other embodiments of temperature management solutions presented herein may be primarily preventative in nature, the process 600 may primarily corrective in nature. When data is recorded at a low temperature, initially, the error rate may be similar to data recorded at higher temperatures. However, as the device temperature rises, the data recorded at lower temperatures may degrade significantly more quickly. Therefore, prioritization of re-writing such data may be desirable.

At block 602, the process 600 may involve receiving a write command. For example, the write command may be received by a data storage device from a host device or system. At block 604, the process 600 involves detecting that the temperature of at least a portion of the data storage device is below a threshold level. At block 606, the process 600 involves writing data associated with write command to non-volatile solid-state memory of the data storage device. Certain embodiments implement write temperature data recording at a block-level; all data of the block may be associated with the same temperature metadata. In certain embodiments, the lowest recorded temperature for a page or segment of data within a block is used to determine the scheduling of garbage collection for the block. In certain embodiments, an integrity scan is implemented periodically (e.g., daily), wherein background activity involves analyzing the health of the memory (e.g., NAND), identifying blocks that were written at low temperature, and scheduling the blocks to be rewritten when the device is at a temperature higher than a threshold (e.g., 25° C.).

Temperature data associated with the write temperature may also be recorded. At block 608, the process 600 involves detecting that the temperature of the data storage device, or portion thereof, has risen above the threshold level, or other threshold level. In certain embodiments, storage devices are configured to execute firmware that records write temperature data indicating the temperature of at least a portion of the device when the relevant data was written.

At block 610, the process 600 involves rewriting the data previously written to the non-volatile solid-state memory of the data storage device to a different block or location of the non-volatile memory after the temperature has risen above the threshold, or other threshold level.

In certain embodiments, at a later time, a background activity may be executed to scan blocks containing data programmed at low temperatures to schedule such blocks for garbage collection when the temperature is in an acceptable range (e.g., above 25° C.). Background data integrity scans may enable this feature as well. Garbage collection activity may be prioritized by the recording temperature; the lower the temperature, the higher the priority may be.

Additional Embodiments

Those skilled in the art will appreciate that in some embodiments, other types of temperature management systems can be implemented while remaining within the scope of the present disclosure. In addition, the actual steps taken in the processes discussed herein may differ from those described or shown in the figures. Depending on the embodiment, certain of the steps described above may be removed, and/or others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, application-specific integrated circuit (ASIC), field-programmable gate array (FPGA), or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

All of the processes described above may be embodied in, and fully automated via, software code modules executed by one or more general purpose or special purpose computers or processors. The code modules may be stored on any type of computer-readable medium or other computer storage device or collection of storage devices. Some or all of the methods may alternatively be embodied in specialized computer hardware.

What is claimed is:

1. A data storage device comprising:
non-volatile solid-state memory;
a temperature sensor;
a heating device; and
a controller configured to:
receive a write command from a host to write host data to the non-volatile solid-state memory;
receive a temperature signal from the temperature sensor indicating a temperature of at least a portion of the data storage device;
determine that the temperature of the at least a portion of the data storage device is below a first predetermined threshold;
prior to writing the host data to the non-volatile solid-state memory, activate the heating device to increase the temperature of the at least a portion of the data storage device; and
when it is determined that the temperature of the at least a portion of the data storage device has risen above a second predetermined threshold, write the host data to the non-volatile solid-state memory.

2. The data storage device of claim 1, wherein the first predetermined threshold is different than the second predetermined threshold.

3. The data storage device of claim 1, wherein the controller is further configured to perform said determining that the temperature of the at least a portion of the data storage device has risen above the second predetermined threshold.

4. The data storage device of claim 1, wherein the first predetermined threshold and the second predetermined threshold are the same.

5. The data storage device of claim 1, wherein the heating device comprises a resistive heating device.

6. The data storage device of claim 1, further comprising a printed circuit board (PCB), wherein the non-volatile solid-state memory is mounted to a first side of the PCB.

7. The data storage device of claim 6, wherein the heating device is mounted to a second side of the PCB opposite the first side.

8. The data storage device of claim 6, wherein the heating device is mounted to the first side of the PCB proximate to the non-volatile solid-state memory.

9. The data storage device of claim 1, wherein the controller is further configured to:
determine whether a critical write condition exists in response to said receiving the write command; and
if the critical write condition exists, perform said writing the host data to the non-volatile solid-state memory without waiting for the temperature of the at least a portion of the data storage device to rise above the second predetermined threshold.

10. A data storage device comprising:
non-volatile solid-state media;
a temperature sensor; and
a controller configured to:
  receive a write command from a host to write host data to the non-volatile solid-state media;
  receive a temperature signal from the temperature sensor indicating a temperature of at least a portion of the data storage device;
  determine that the temperature is below a threshold;
  prior to writing the host data to the non-volatile solid-state media, transfer data between the controller and the non-volatile solid-state media to increase the temperature of the at least a portion of the data storage device; and
  when it is determined that the temperature of the at least a portion of the data storage device has risen above a second predetermined threshold, write the host data to the non-volatile solid-state media.

11. The data storage device of claim 10, wherein said transferring data between the controller and the non-volatile solid-state media comprises reading data stored in the non-volatile solid-state media.

12. The data storage device of claim 11, wherein said transferring data between the controller and the non-volatile solid-state media further comprises introducing errors into data read from the non-volatile solid-state media to increase error correction activity in the data storage device.

13. The data storage device of claim 10, wherein said transferring data between the controller and the non-volatile solid-state media comprises performing one or more data operations on a reserved area of the non-volatile solid-state media that is not used to store host data.

14. The data storage device of claim 10, wherein said transferring data between the controller and the non-volatile solid-state media comprises performing data management activities on the non-volatile solid-state media.

15. The data storage device of claim 10, wherein the controller is further configured to: after said transferring data between the controller and the non-volatile solid-state media determine whether the temperature is at or above the threshold, and if so, notify a host device that the data storage device is ready to receive write commands.

16. A data storage device comprising:
non-volatile solid-state memory;
a temperature sensor; and
a controller configured to:
  receive a write command from a host to write host data to the non-volatile solid-state memory;
  receive a temperature signal from the temperature sensor indicating a temperature of at least a portion of the data storage device;
  determine that the temperature is below a first predetermined threshold based on the temperature signal;
  write the host data to the non-volatile solid-state memory;
  store write temperature data indicating that a write temperature associated with said writing the host data is below the first predetermined threshold;
  determine that the temperature of the at least a portion of the data storage device has risen above a second predetermined threshold; and
  re-write the previously-written host data to the non-volatile solid-state memory based at least in part on the write temperature data in response to said determining that the temperature of the at least a portion of the data storage device has risen above the second predetermined threshold.

17. The data storage device of claim 16, wherein said re-writing the host data based at least in part on the write temperature data comprises prioritizing garbage collection operations of the data storage device based on the write temperature data.

18. The data storage device of claim 16, wherein the first predetermined threshold and the second predetermined threshold are the same.

19. The data storage device of claim 16, wherein the write temperature data indicates whether the data associated with the write command was written when the at least a portion of the data storage device was below the first predetermined threshold.

* * * * *